United States Patent
Sakashita et al.

(10) Patent No.: US 7,252,719 B2
(45) Date of Patent: Aug. 7, 2007

(54) HIGH PRESSURE PROCESSING METHOD

(75) Inventors: Yoshihiko Sakashita, Takasago (JP); Katsumi Watanabe, Takasago (JP); Hisanori Oshiba, Takasago (JP); Shogo Sarumaru, Takasago (JP); Yusuke Muraoka, Kyoto (JP); Kimitsugu Saito, Kyoto (JP); Ikuo Mizobata, Kyoto (JP); Ryuji Kitakado, Kyoto (JP)

(73) Assignees: Kabushiki Kaisha Kobe Seiko Sho, Kobe-shi (JP); Dainippon Screen Mfg. Co., Ltd., Kyoto-shi (JP)

( * ) Notice: Subject to any disclaimer, the term of this patent is extended or adjusted under 35 U.S.C. 154(b) by 0 days.

(21) Appl. No.: 11/249,444

(22) Filed: Oct. 14, 2005

(65) Prior Publication Data

US 2006/0032520 A1 Feb. 16, 2006

Related U.S. Application Data

(62) Division of application No. 10/826,309, filed on Apr. 19, 2004, now Pat. No. 7,000,653, which is a division of application No. 10/131,193, filed on Apr. 25, 2002, now Pat. No. 6,823,880.

(30) Foreign Application Priority Data

Apr. 25, 2001 (JP) ............................. 2001-128276
Apr. 27, 2001 (JP) ............................. 2001-133003

(51) Int. Cl.
*B08B 3/02* (2006.01)
(52) U.S. Cl. .......................................... 134/33; 134/34
(58) Field of Classification Search ............... 134/94.2, 134/95.1, 95.2, 200, 902, 33, 34
See application file for complete search history.

(56) References Cited

U.S. PATENT DOCUMENTS 4,197,000 A * 4/1980 Blackwood ................. 396/625

(Continued)

FOREIGN PATENT DOCUMENTS

JP 59-161826 9/1984

(Continued)

*Primary Examiner*—Frankie L. Stinson
(74) *Attorney, Agent, or Firm*—Oblon, Spivak, McClelland, Maier & Neustadt, P.C.

(57) ABSTRACT

A high-pressure processing apparatus includes a processing vessel including a processing chamber formed therein to perform a certain process onto an object in the processing chamber; fluid feeding means which feeds a high-pressure fluid into the processing chamber; fluid discharging means which discharges the high-pressure fluid from the processing chamber; an agitating unit which is arranged in the processing chamber and is operative to flow the high-pressure fluid over the object by relative rotation to the processing vessel; a communicating channel which is formed in the processing vessel to communicate inside and outside of the processing chamber; a rotary driving member which is coupled to the agitating unit via a shaft portion provided in the communicating channel; and a sealing portion which is provided between the shaft portion and the processing vessel to disconnect the processing chamber from the rotary driving member. The fluid discharging means includes a fluid discharging port formed in a certain position of the communicating channel closer to the processing chamber than the sealing portion to discharge the high-pressure fluid.

2 Claims, 11 Drawing Sheets

U.S. PATENT DOCUMENTS

| | | | |
|---|---|---|---|
| 5,037,506 A * | 8/1991 | Gupta et al. | 438/706 |
| 5,226,242 A * | 7/1993 | Schwenkler | 34/78 |
| 5,238,773 A * | 8/1993 | Babich et al. | 430/190 |
| 5,279,921 A * | 1/1994 | Onishi et al. | 430/270.1 |
| 5,286,599 A * | 2/1994 | Babich et al. | 430/270.1 |
| 5,457,005 A * | 10/1995 | Babich et al. | 430/296 |
| 5,707,487 A * | 1/1998 | Hori et al. | 438/703 |
| 5,718,763 A | 2/1998 | Tateyama et al. | |
| 5,763,016 A * | 6/1998 | Levenson et al. | 427/510 |
| 5,783,367 A * | 7/1998 | Maruyama et al. | 430/313 |
| 5,881,750 A * | 3/1999 | Yoshitani | 156/345.23 |
| 5,908,510 A | 6/1999 | McCullough et al. | |
| 5,954,911 A * | 9/1999 | Bergman et al. | 156/345.29 |
| 6,033,134 A * | 3/2000 | Maruyama et al. | 396/611 |
| 6,056,026 A | 5/2000 | Fosnight et al. | |
| 6,199,604 B1 | 3/2001 | Miyajima | |
| 6,276,378 B1 | 8/2001 | Taniyama et al. | |
| 6,629,539 B1 | 10/2003 | Yanagita et al. | |
| 6,660,460 B2 * | 12/2003 | Sahbari | 430/331 |

FOREIGN PATENT DOCUMENTS

| | | |
|---|---|---|
| JP | 60-187303 | 9/1985 |
| JP | 60-192333 | 9/1985 |
| JP | 63-221803 | 9/1988 |
| JP | 64-45125 | 2/1989 |
| JP | 5-326472 | 12/1993 |
| JP | 10-125644 | 5/1998 |
| JP | 11-87306 | 3/1999 |
| JP | 2000-340540 | 12/2000 |

* cited by examiner

HIGH PRESSURE PROCESSING METHOD

This application is a divisional of U.S. application Ser. No. 10/826,309, filed Apr. 19, 2004, now U.S. Pat. No. 7,000,653 which is a divisional application of U.S. application Ser. No. 10/131,193, filed Apr. 25, 2002, now U.S. Pat. No. 6,823,880, issued Nov. 30, 2004 and is based upon and claims the benefit of priority from the prior Japanese Patent Application Numbers 2001-128276, filed Apr. 25, 2001 and 2001-133003, filed Apr. 27, 2001, the entire contents of each of which are incorporated herein by reference.

BACKGROUND OF THE INVENTION AND RELATED ART STATEMENT

This invention relates to an apparatus and method for performing a predetermined process to samples (objects to be treated) having a microstructure such as semiconductor substrates and micromachines, and particularly to a processing apparatus and a processing method for performing a processing with use of a high-pressure fluid such as supercritical fluid, subcritical fluid or liquefied gas.

Recently, large-scaled integrated circuits have been formed on semiconductor substrates. As the integrated circuits have been formed at a larger scale, the line width of a circuit pattern to be formed on a semiconductor wafer has decreased to the order of submicron. As the line width is narrowed, capillary force is acted on the gas-liquid interface of the substrate wafer when the semiconductor wafer is dried under an atmospheric pressure after washing with a chemical. As a result, it is highly likely that the size of the pores and grooves in the semiconductor wafer may be reduced or cracks may be generated on the wafer surface.

A supercritical dying process has been proposed to eliminate the above drawbacks resulting from capillary force. The supercritical drying process is a process of drying semiconductor wafers with use of a supercritical fluid, namely, a fluid which has a property of a substantially interim state between gas phase and liquid phase and whose density is close to that of liquid and whose diffusion coefficient and viscosity are close to those of gas by allowing a material (fluid) to exceed a critical point (critical temperature, critical pressure) inherent to the material. The supercritical drying process is free from generation of gas-liquid interface, and accordingly, semiconductor wafers can be dried without causing size reduction of the pores and grooves or generating crack, which may result collapse of microstructures around the grooves. Japanese Unexamined Patent Publication No. HEI 11-87306 discloses an exemplified supercritical drying apparatus with use of a supercritical fluid. Japanese Unexamined Patent Publication No. HEI 10-125644 discloses a method for removing residual matters from the semiconductor substrate surfaces with use of a supercritical fluid (supercritical carbon dioxide). Japanese Unexamined Patent Publication No. SHO 60-192333 discloses a method for removing resist with use of a supercritical fluid or liquefied gas.

In a physically strict sense, there is no boundary region in a supercritical region. For instance, there is a high-pressure fluid exhibiting generally the same property as a supercritical fluid even at a temperature lower than a critical point. Such a fluid is called as a subcritical fluid. The subcritical fluid can be used in a predetermined process to eliminate the drawbacks resulting from capillary stress in the similar manner as a supercritical fluid.

Allowing a supercritical fluid or the like to flow (agitating a fluid) is effective in performing an efficient and uniform drying process onto substrates such as semiconductor wafers in a drying process with use of a supercritical fluid or the like. In view of this, Japanese Unexamined Patent Publication No. HEI 11-87306 discloses an agitating apparatus equipped with an agitating rotary mechanism having an agitating wing to agitate a fluid in a pressure vessel (processing chamber), and a substrate rotary mechanism for rotating a substrate in the pressure vessel.

The drying apparatus equipped with the agitating apparatus enables to perform an efficient and uniform drying process onto a substrate, but may likely to cause contamination of the substrate due to adhesion of particles and the like. It is a general practice in the drying apparatus equipped with the agitating apparatus to provide a power source (e.g. motor) outside of the pressure vessel for driving the agitating apparatus so as to transmit a driving force of the power source to the interior of the vessel via a rotary shaft that has been sealed against a high pressure. In such an arrangement, dusts (particles) may be generated in the sealed portion of the rotary shaft due to abrasion of the rotary shaft, which may likely to intrude into the vessel. There is an idea of providing a power source inside a pressure vessel to omit the sealed portion of the rotary shaft. In such a case, a rotary portion of the agitating wing and many of the parts which may likely to cause metal contamination are arranged inside the pressure vessel, thus resulting in contamination of substrates.

As mentioned above, none of the above techniques is satisfactory in production of semiconductor substrates and the like which requires strict control on preventing contamination of the substrates with particles and other foreign matters. There has been a demand for an apparatus and method which can solve the above drawbacks.

There is another idea of implementing a series of processes from a chemical treating process to a drying process in a high-pressure vessel (chamber) in the aforementioned supercritical processing apparatus (high-pressure processing apparatus). According to this technique, a substrate is transported to a pressure vessel of the supercritical processing apparatus, treated with a variety of chemicals by being supplied with the chemicals one after another, and dried by a supercritical fluid.

In the above apparatus, the pressure vessel and pipes connected thereto are generally made of a metallic material in light of the fact that a high-pressure fluid (supercritical fluid) is used. Some of the chemicals used in the chemical treatment have a property of corroding a metal. Accordingly, there should be considered a problem relating to corrosion, e.g., a problem that particles and the like may be generated.

In order to solve the above problems, Japanese Unexamined Patent Publication No. SHO 64-45125 discloses an idea of coating the parts which is likely to be corroded with a corrosion-resistive agent (made of e.g. quartz or fluoroethylene resin), and Japanese Unexamined Patent Publication No. SHO 63-221803 discloses an idea of applying a corrosion-resistive lining.

It is necessary to apply the corrosion-resistive agent to the pipes connected to the pressure vessel as well as to the pressure vessel (processing chamber). However, it is technically difficult to apply a corrosion-resistive agent to the pipes having a small diameter and a long length. Also, some of the corrosion-resistive agents have inferior durability in high-pressure use. Accordingly, use of such agents having inferior durability is practically infeasible.

In view of the above, there has been a demand for solving the problems relating to corrosion in the supercritical processing apparatus.

SUMMARY OF THE INVENTION

In view of the above, it is an object of the invention to provide a high-pressure processing apparatus and a high-pressure processing method that have solved the above problems residing in the prior art.

According to an aspect of the invention, the high-pressure processing apparatus includes: a processing vessel including a processing chamber formed therein to perform a certain process onto an object in the processing chamber; fluid feeding means which feeds a high-pressure fluid into the processing chamber; fluid discharging means which discharges the high-pressure fluid from the processing chamber; an agitating unit which is arranged in the processing chamber and is operative to flow the high-pressure fluid over the object by relative rotation to the processing vessel; a communicating channel which is formed in the processing vessel to communicate inside and outside of the processing chamber; a rotary driving member which is coupled to the agitating unit via a shaft portion provided in the communicating channel; and a sealing portion which is provided between the shaft portion and the processing vessel to disconnect the processing chamber from the rotary driving member. The fluid discharging means includes a fluid discharging port formed in a certain position of the communicating channel closer to the processing chamber than the sealing portion to discharge the high-pressure fluid.

According to another aspect of the invention, the high-pressure processing apparatus includes: a processing vessel including a processing chamber formed therein; a support member which supports an object loaded in the processing chamber thereon; fluid feeding/discharging means which feeds and discharges a high-pressure fluid in and out of the processing chamber; a communicating channel which is formed in the processing vessel to communicate with the processing chamber; a valve structural member which is operatively supported to the processing vessel in the communicating channel to openably close the communicating channel; and a piping member which is communicated and connected to the communicating channel for feeding and/or discharging a corrosive fluid in and out of the processing chamber. The corrosive fluid is different from the high-pressure fluid.

DETAILED DESCRIPTION OF THE PREFERRED EMBODIMENT OF THE INVENTION

Preferred embodiments of the invention are described with reference to the accompanying drawings.

Figure 1:
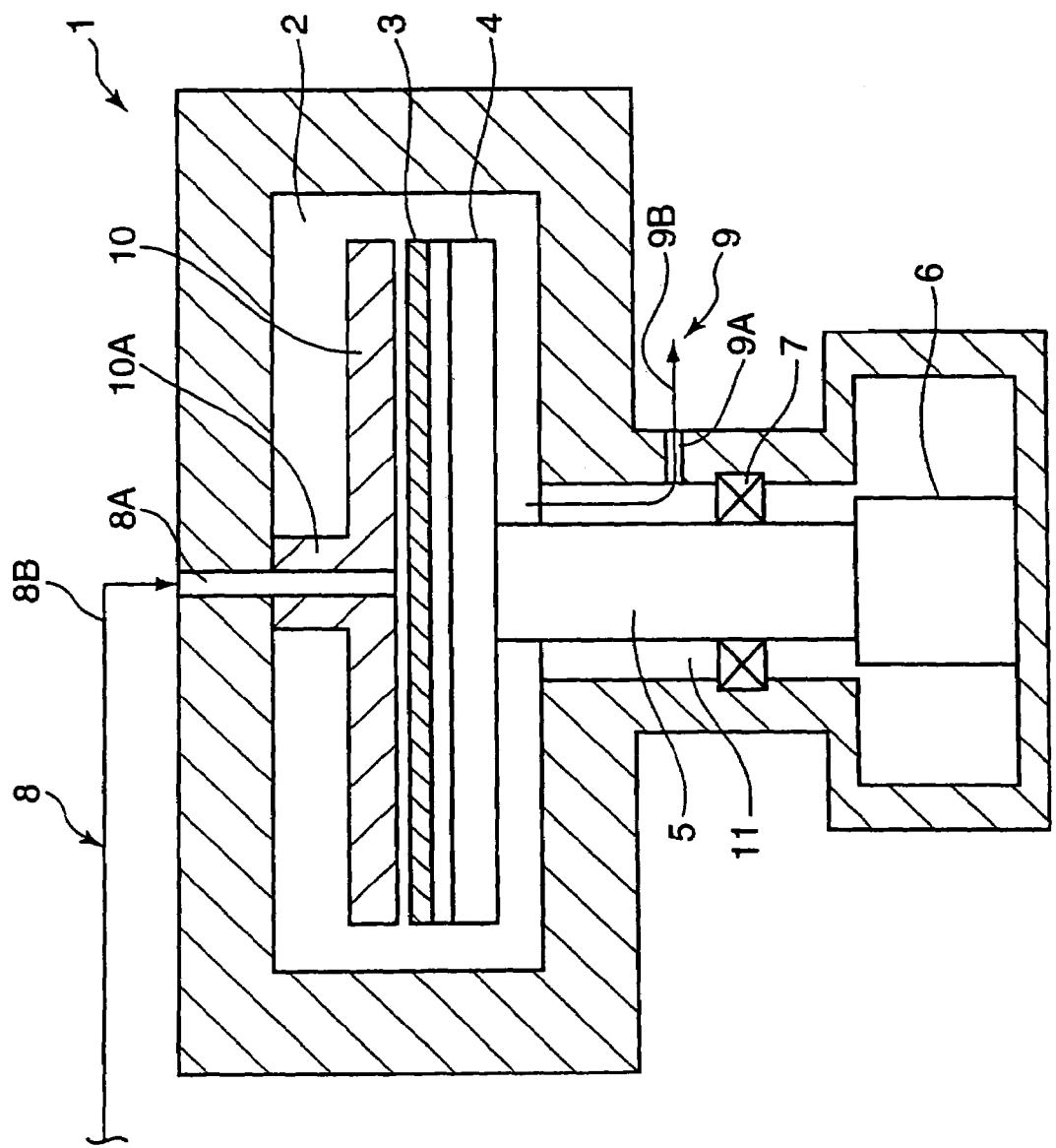
FIG. 1 is a sectional view showing a high-pressure processing apparatus according to a first embodiment of the invention.
Figure 2:
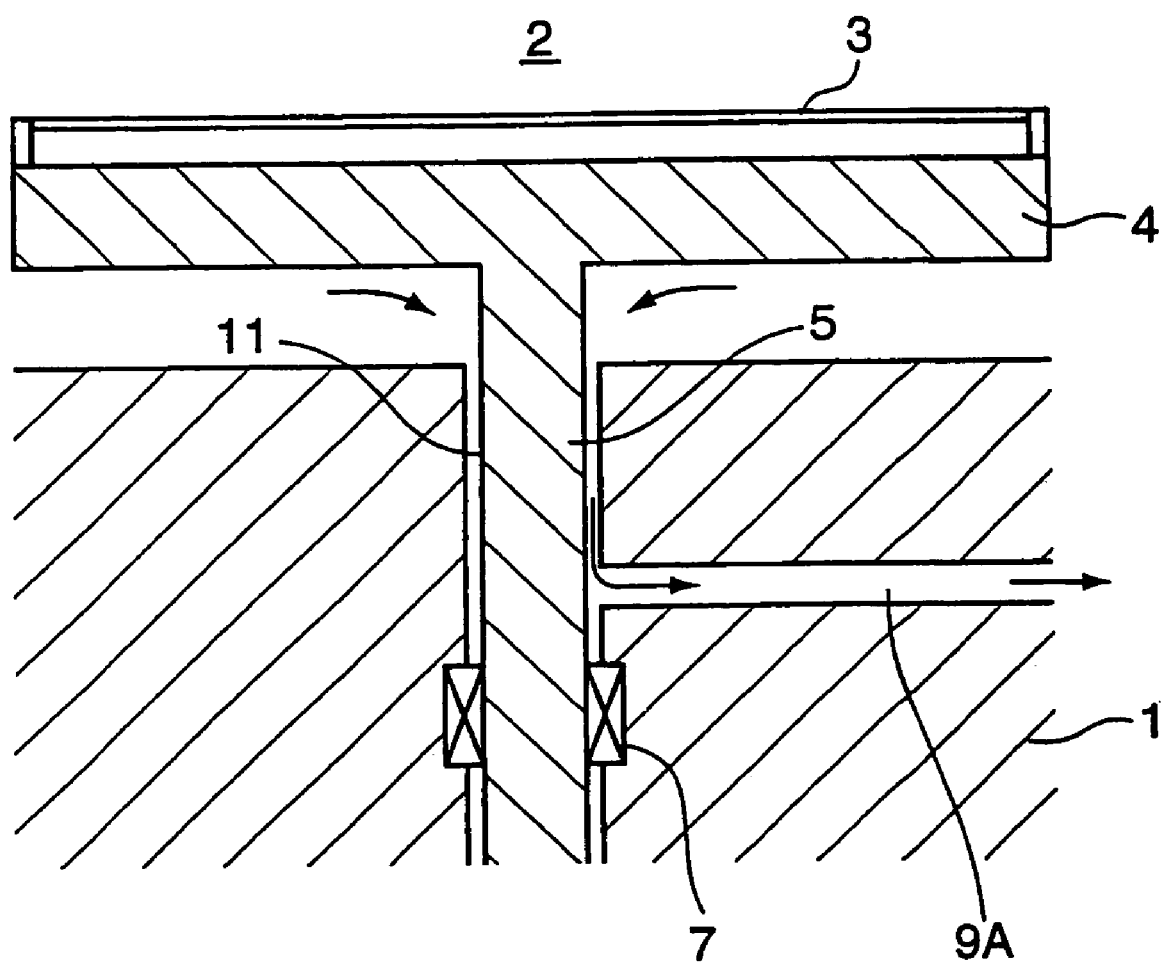
FIG. 2 is a sectional view showing essential parts of a pressure vessel.

FIGS. 1 and 2 are sectional views each schematically showing a high-pressure processing apparatus as a first embodiment according to the invention. As shown in these drawings, a pressure vessel (processing vessel) 1 is internally formed with a processing chamber 2. A rotatable support member 4 is accommodated in the processing chamber 2 to load an object 3 to be treated such as a semiconductor substrate (wafer) thereon.

The object 3 is loadable and unloadable to and from the processing chamber 2 by transporting means (not shown) such as a handling robot. In view of this, the pressure vessel 1 has a two-parts unit consisting of a vessel main body and a lid member, or an upper member and a lower member to openably close the processing chamber 2. Alternatively, a window is formed in a trunk part or other part of the pressure vessel 1 through which the object 3 is insertable, and is openably closed by a door or its equivalent. The processing chamber 2 has such a construction that a pressure in the range from 70 to 200 kgf·f/cm$^2$ (from about 7 to about 20 MPa) can be kept in a drying process by sealably closing the processing chamber 2.

The support member 4 (agitating unit) is provided in the processing chamber 2 to be rotatable (to be capable of agitating) by way of a shaft portion 5 coupled to a rotary driving member 6. The support member 4 is rotatable by driving the rotary driving member 6.

The rotary driving member 6 includes an electric motor or a fluid motor, and is provided outside of the processing chamber 2 in a disconnected state from the interior of the processing chamber 2. Specifically, a communicating channel 11 communicating with inside and outside of the processing chamber 2 is formed in the pressure vessel 1, and the shaft portion 5 is inserted in the communicating channel 11. Mounting a shaft seal portion 7 at a certain part of the shaft portion 5 to seal the shaft portion 5 and a wall surface of the communicating channel 11 in contact therewith enables to disconnect the rotary driving member 6 from the processing chamber 2. In other words, isolating the rotary driving member 6 from the processing chamber 2 enables to prevent contamination of the object 3 (metal contamination due to intrusion of metallic particles by abrasion) as the rotary driving member 6 is rotated.

Fluid feeding means 8 and fluid discharging means 9 for respectively feeding and discharging a high-pressure fluid (gas, liquid, subcritical fluid, supercritical fluid) are connected to the processing chamber 2. In this embodiment, supercritical carbon dioxide is feedable and dischargeable as a high-pressure fluid.

The fluid feeding means 8 includes a fluid feeding port 8A formed in the pressure vessel 1, and a fluid feeding line 8B provided with a cylinder, pipe, and valve, etc., which is communicated and connected to the fluid feeding port 8A. The fluid feeding port 8A is communicated to a through-hole of a boss portion 10A of an atmosphere controlling member 10 provided in a central part on a top part of the atmosphere controlling member 10. With this arrangement, supercritical carbon dioxide is fed to the middle part on the upper part of the processing chamber 2 by way of the controlling member 10.

The fluid discharging means 9 includes a fluid discharging port 9A formed in an appropriate position of the communicating channel 11, and a fluid discharging line 9B provided with a cylinder, pump, valve, etc., which is communicated to the fluid discharging port 9A. The fluid discharging port 9A is formed at a position closer to the processing chamber 2 than the shaft seal portion 7, and is constructed in such a manner that the supercritical carbon dioxide fed into the processing chamber 2 is discharged through the fluid discharging port 9A by way of the communicating channel 11.

Next, processing operations of the high-pressure processing apparatus having the above construction are described.

In the high-pressure processing apparatus, first, an object 3 is transported to the processing chamber 2 of the pressure vessel 1 by the transporting means such as a handling robot, and is loaded on the support member 4. Then, the processing chamber 2 is sealably closed, and thereafter, supercritical carbon dioxide is supplied to the processing chamber 2 by the fluid feeding means 8 to perform a predetermined process (washing, drying, developing) onto the object 3. At this time, part of the supercritical carbon dioxide is discharged outside of the processing chamber 2 through the fluid discharging port 9A, thereby maintaining the pressure inside the processing chamber 2 at a constant pressure suitable for the processing.

In the processing, the support member 4 is rotated at a rotating speed in the range e.g. from 50 to 1000 rpm by actuation of the rotary driving member 6. Thereby, the supercritical carbon dioxide is effectively allowed to flow onto the object 3 to perform uniform processing (washing, drying, developing).

As the support member 4 is rotated, particles may be generated around the shaft seal portion 7 or its vicinity, which may likely to intrude in the processing chamber 2 through the communicating channel 11, thus resulting in contamination of the object 3. However, in the above processing apparatus, since the fluid discharging port 9A is formed at the appropriate position of the communicating channel 11, the supercritical carbon dioxide is discharged outside of the pressure vessel 1 through the communicating channel 11 and the fluid discharging port 9A during the processing in the directions of arrows shown in FIG. 2. Thus, the particles which have been generated around the shaft seal portion 7 are pushed back (kept from going upward) by the pressure of the flowing fluid or discharged outside of the pressure vessel 1. There is a possibility that particles may be generated due to malcontact or the like which results from axial displacement of the shaft portion 5. Such particles can be discharged outside of the pressure vessel 1 along with the supercritical carbon dioxide flowing through the communicating channel 11 and the fluid discharging port 9A. Thus, this arrangement prevents particles generated around the shaft seal portion 7 from intruding into the processing chamber 2.

After the processing onto the object 3 has been completed, feeding of the supercritical carbon dioxide into the processing chamber 2 is suspended, and driving of the support member 4 is suspended. After it is confirmed that the supercritical carbon dioxide has been completely discharged, the pressure in the processing chamber 2 is returned to the atmospheric pressure. Thereafter, the object 3 is unloaded from the pressure vessel 1 by the transporting means. In this way, a series of processes are completed.

In the high-pressure processing apparatus, since supercritical carbon dioxide is allowed to flow over the object 3 by rotating the object 3 (support member 4), the processing onto the object 3 can be efficiently and uniformly performed. Furthermore, since the rotary driving member 6 for drivingly rotating the support member 4 is provided outside of the processing chamber 2 in a disconnected state therefrom, metal contamination due to driving of the rotary driving member 6 can be prevented, which resultantly prevents intrusion of particles which have been generated around the shaft seal portion 7 into the processing chamber 2. This arrangement enables to prevent contamination of the object 3 due to particle intrusion and the like.

Next, a high-pressure processing apparatus as a second embodiment according to the invention is described with reference to FIGS. 3 and 4. The arrangement of the second embodiment to a fourth embodiment is basically the same as that of the first embodiment. Accordingly, elements in the second to the fourth embodiments that are identical to those in the first embodiment are denoted at the same reference numeral, a description thereof is omitted herein, and parts of the second to the fourth embodiments which are different from the features of the first embodiment are described in detail.

Figure 3:
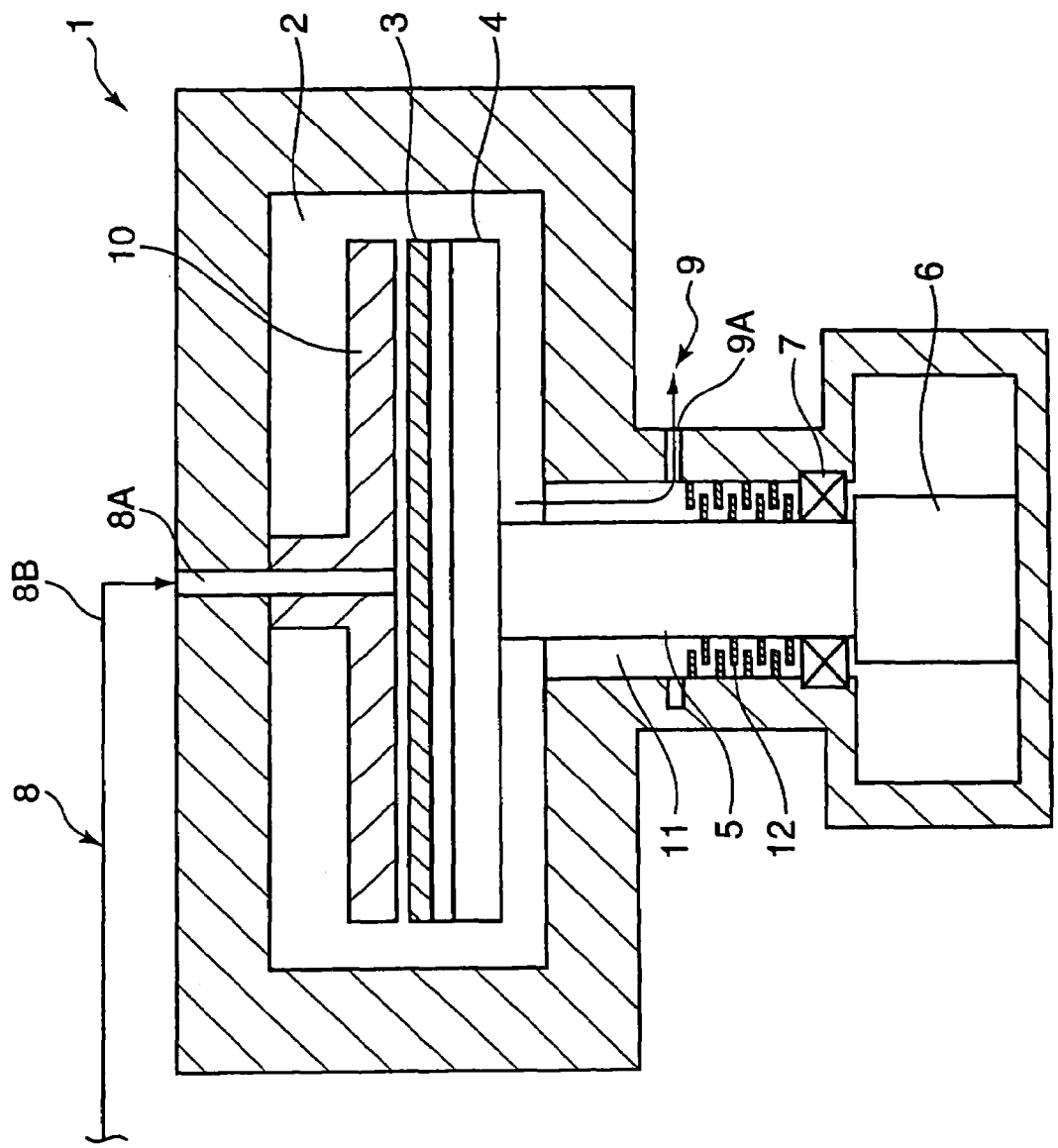
FIG. 3 is a sectional view showing a high-pressure processing apparatus according to a second embodiment of the invention.
Figure 4:
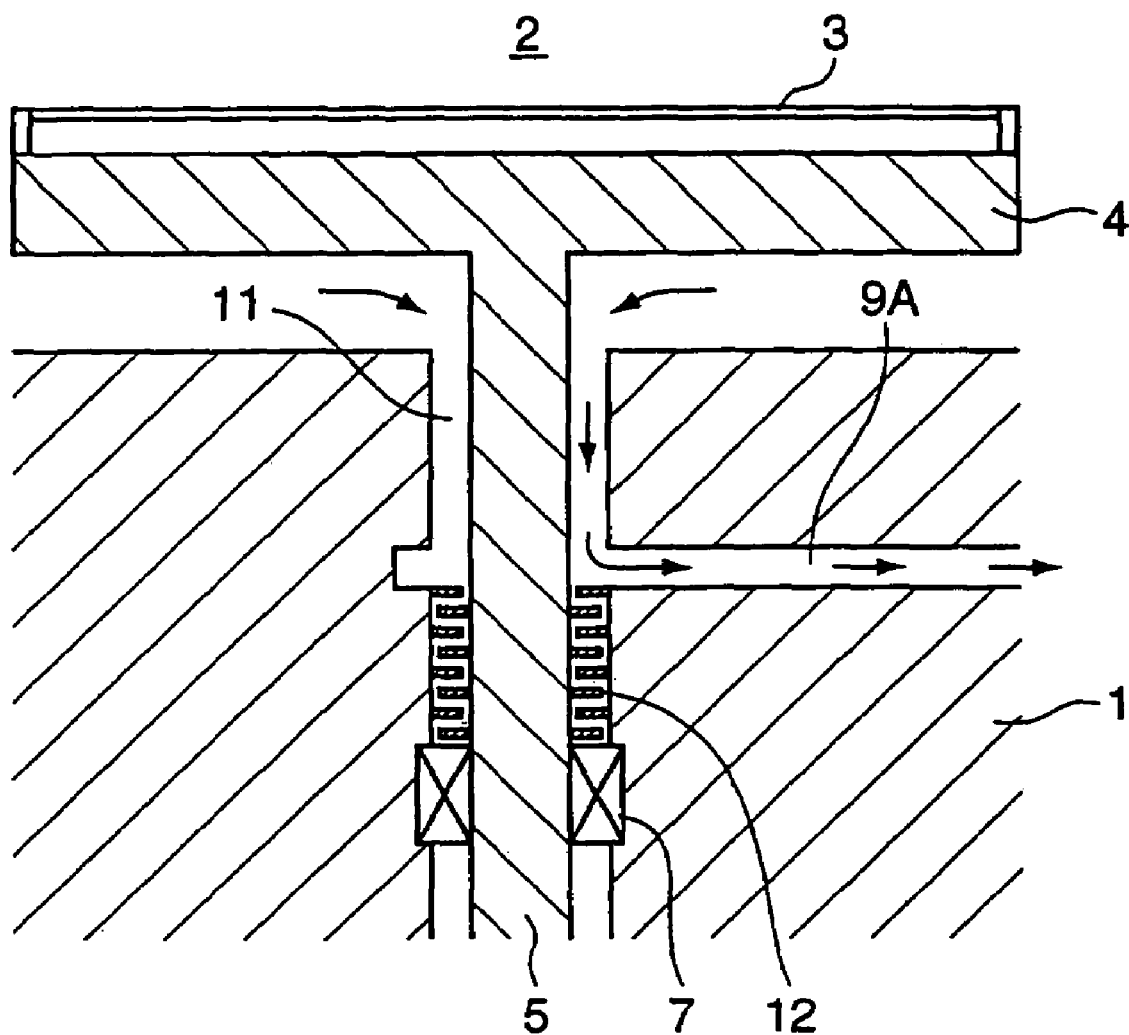
FIG. 4 is a sectional view showing essential parts of a pressure vessel.

The high-pressure processing apparatus according to the second embodiment is, as shown in FIGS. 3 and 4, provided with a labyrinth structure 12 at an appropriate position of a communicating channel 11 and between a shaft seal portion 7 and a fluid discharging port 9A.

The labyrinth structure 12 is formed by arraying a plurality of annular blocking plates in the axial direction of a shaft portion 5 at an equidistance and spaced apart one from another in such a manner that the blocking plates are protruding horizontally from a wall surface of the communicating channel 11 and from an outer circumferential surface of the shaft portion 5 vertically alternately.

According to the second embodiment, since the labyrinth structure 12 is provided between the shaft seal portion 7 and the processing chamber 2, particles that have been generated around the shaft seal portion 7 are blocked from moving toward the processing chamber 2 through the communicating channel 11. Accordingly, this arrangement enables to more effectively prevent intrusion of particles into the processing chamber 2.

Figure 5:
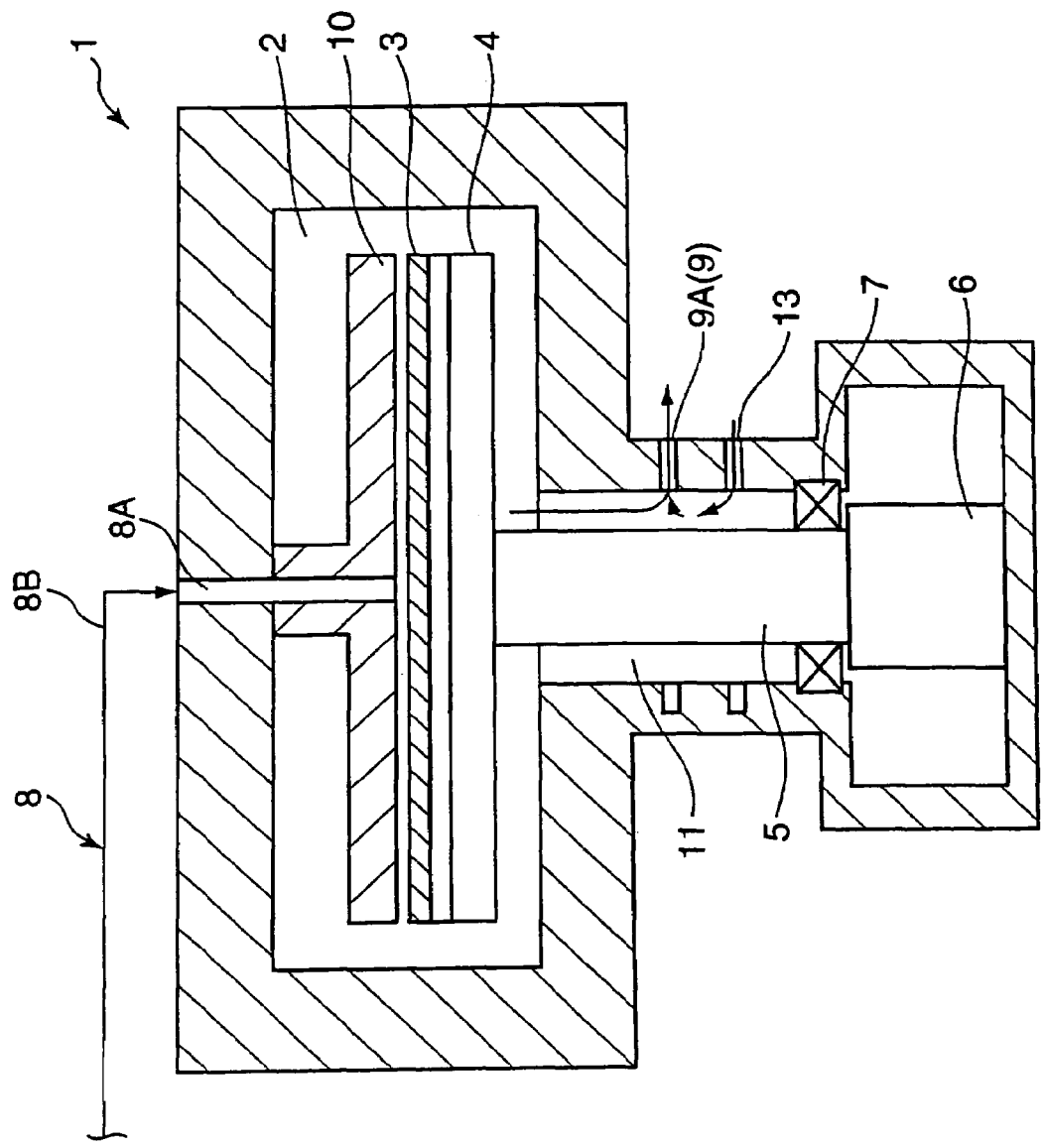
FIG. 5 is a sectional view showing a high-pressure processing apparatus according to a third embodiment of the invention.
Figure 6:
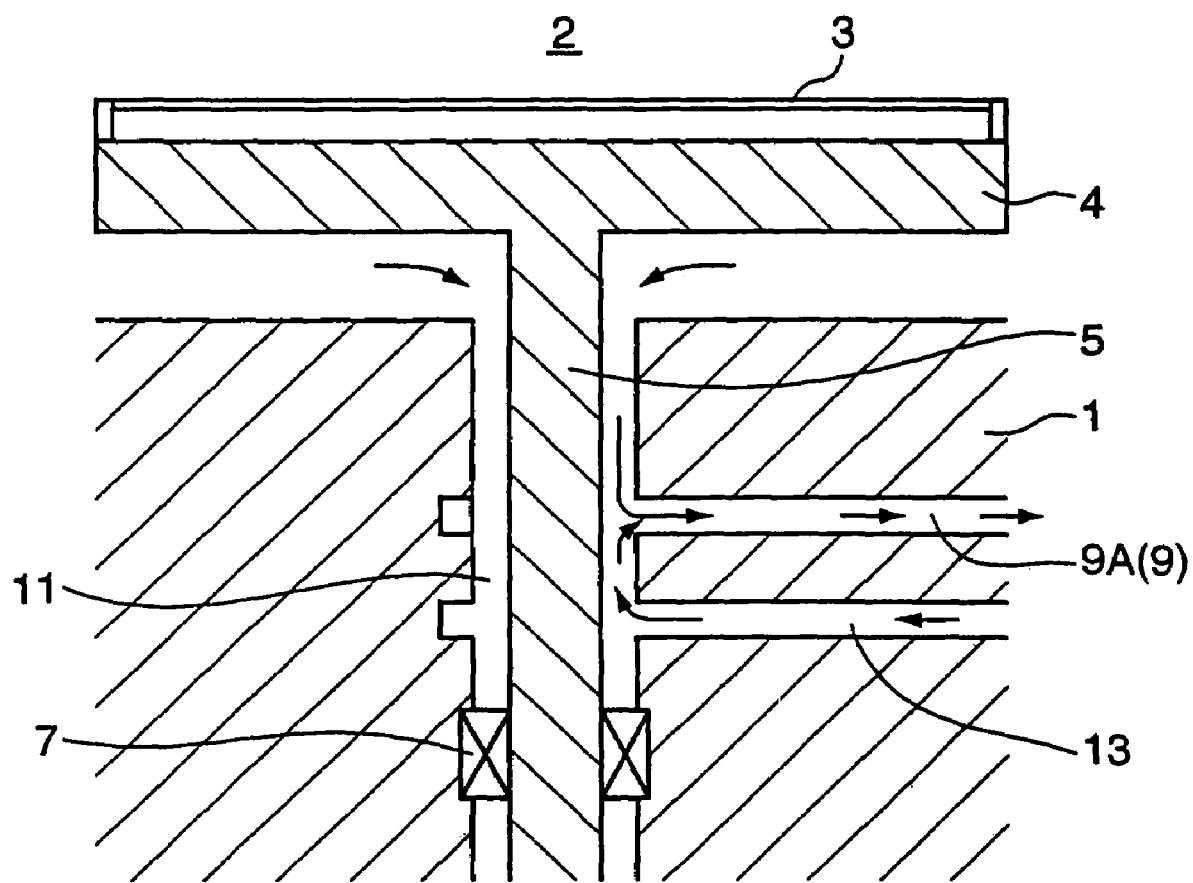
FIG. 6 is a sectional view showing essential parts of a pressure vessel.

Next, a high-pressure processing apparatus as a third embodiment according to the invention is described with reference to FIGS. 5 and 6.

The high-pressure processing apparatus according to the third embodiment is formed with a fluid introducing channel 13 at an appropriate position of a communicating channel 11 and between a shaft seal portion 7 and a fluid discharging port 9A to draw supercritical carbon dioxide into the communicating channel 11.

According to the third embodiment, supercritical carbon dioxide is drawn from the introducing channel 13 into the communicating channel 11, and is discharged outside of a pressure vessel 1 through the fluid discharging port 9A. With this arrangement, particles that have been generated around the shaft seal portion 7 are discharged out of the pressure vessel 1 through the fluid discharging port 9A along with the flow of the supercritical carbon dioxide. Thus, intrusion of particles into a processing chamber 2 is prevented.

It should be appreciated that the fluid to be introduced to the introducing channel 13 is not limited to the supercritical carbon dioxide, and may include other fluid, e.g., inert gas such as argon gas and nitrogen gas.

Next, a high-pressure processing apparatus as a fourth embodiment according to the invention is described with reference to FIGS. 7 and 8.

The high-pressure processing apparatus according to the fourth embodiment has an arrangement in which the features of the second and third embodiments are combined. Specifically, as shown in FIGS. 7 and 8, the apparatus is provided with a fluid introducing channel 13 at an appropriate position of a communicating channel 11 and between a shaft seal portion 7 and a fluid discharging port 9A to draw supercritical carbon dioxide or other fluid into the communicating channel 11, and labyrinth structures 12A, 12B are provided between the shaft seal portion 7 and the introducing channel 13, and between the introducing channel 13 and the fluid discharging port 9A, respectively.

According to the fourth embodiment, the labyrinth structures 12A and 12B block particles and the like that have been generated around the shaft seal portion 7 from moving toward a processing chamber 2. Even if some of the particles have been intruded in the processing chamber 2, such particles are forcibly discharged outside of a pressure vessel 1 through the fluid discharging port 9A along with the fluid flowing through the introducing channel 13 and the communicating channel 11. This arrangement enables to more securely prevent intrusion of particles and the like into the processing chamber 2.

Figure 7:
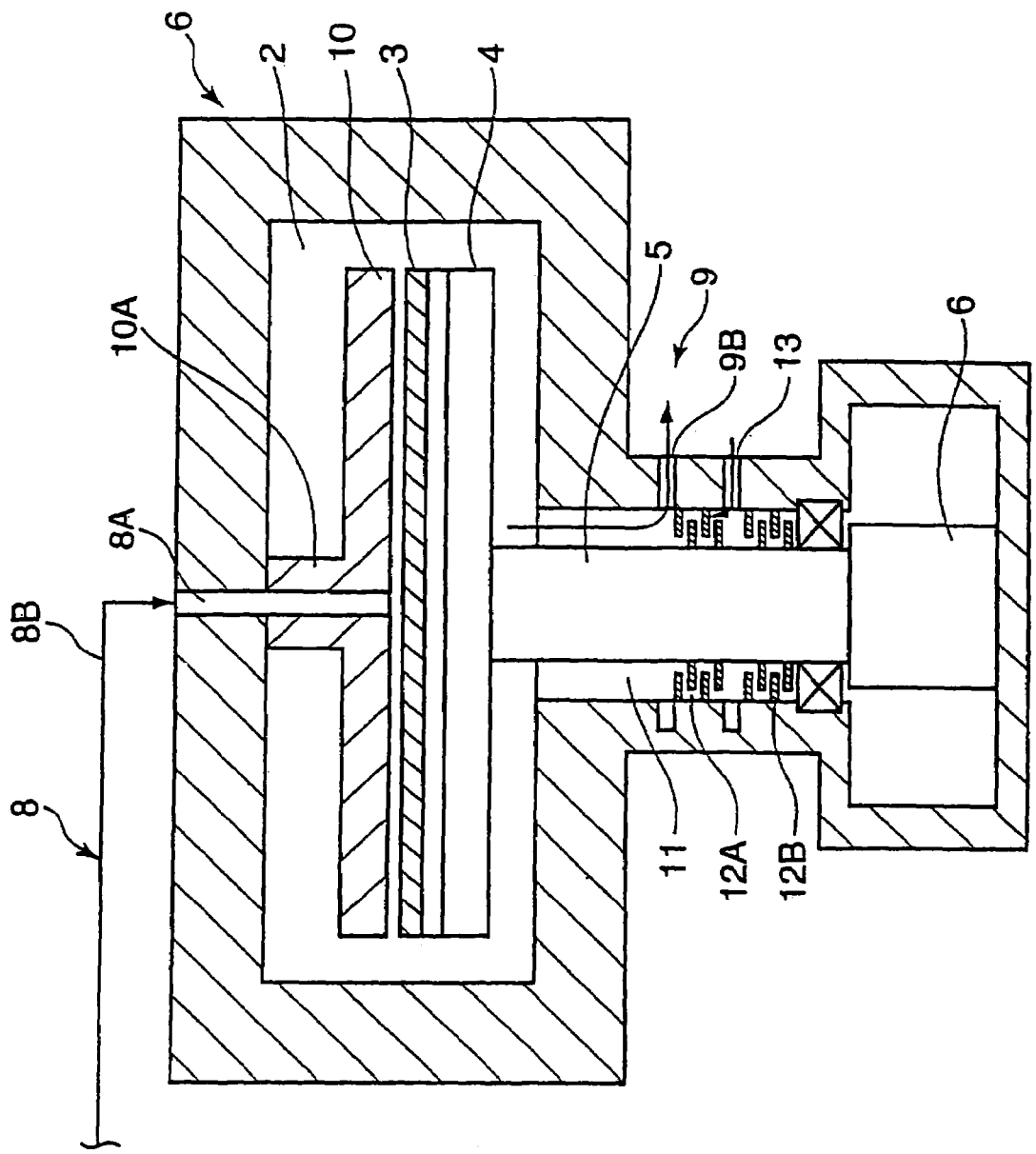
FIG. 7 is a sectional view showing a high-pressure processing apparatus according to a fourth embodiment of the invention.
Figure 8:
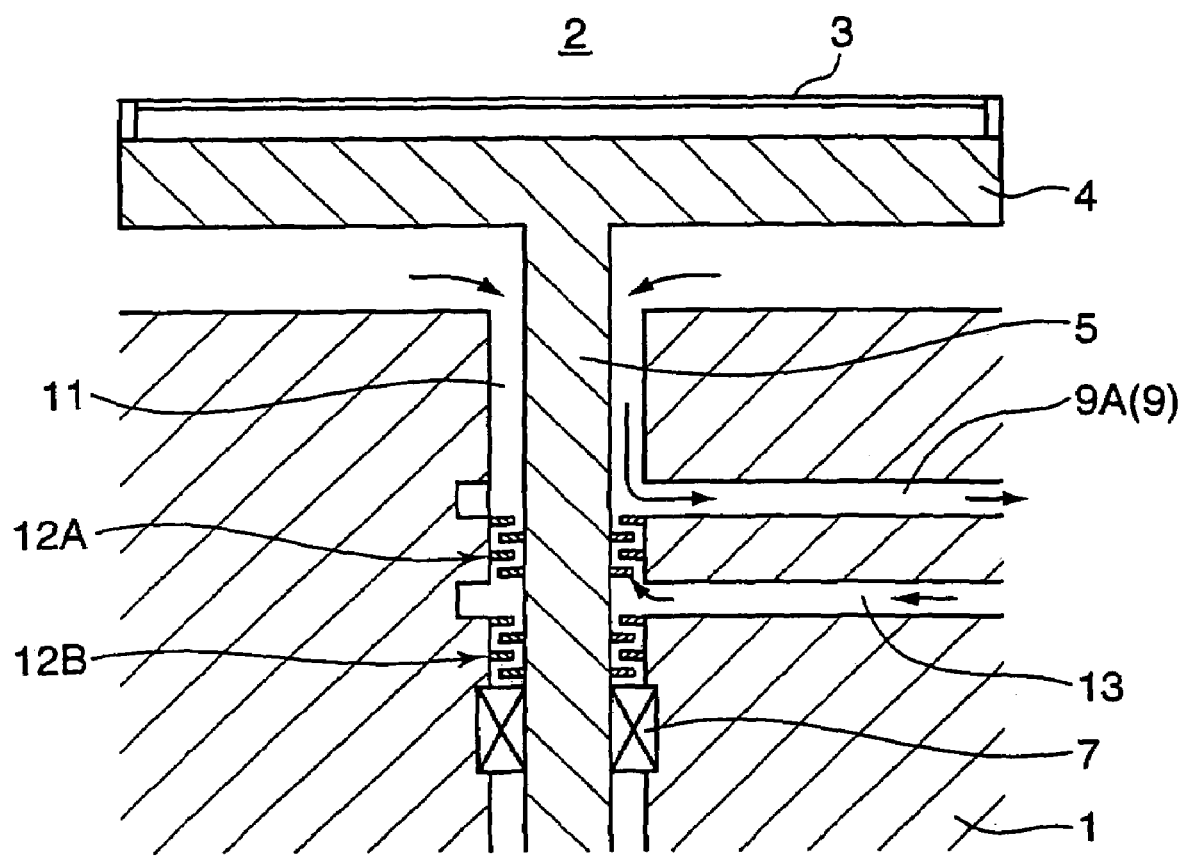
FIG. 8 is a sectional view showing essential parts of a pressure vessel.

In the fourth embodiment shown in FIGS. 7 and 8, the labyrinth structures 12A, 12B are provided between the shaft seal portion 7 and the introducing channel 13, and between the introducing channel 13 and the fluid discharging port 9A, respectively. As an altered form, merely one of the labyrinth structures 12A and 12B may be provided.

In the first to the fourth embodiments, supercritical carbon dioxide ($CO_2$) is used as a high-pressure fluid. Alternatively, in case of washing, a chemical or the like may be dissolved in carbon dioxide for mixture, or a chemical may be fed separately into the processing chamber 2.

In the case where a chemical or the like is mixed, it is preferable to adopt the arrangement of the third embodiment or the fourth embodiment. More specifically, in the case where a chemical to be mixed with a high-pressure fluid has a property of corroding the shaft seal portion 7, the arrangement other than the arrangement of the third embodiment or the fourth embodiment may cause corrosion of the shaft seal portion 7 due to contact of the chemical with the shaft seal portion 7. In order to prevent such a drawback, it is required to perform a corrosion-resistive process such as applying a corrosion-resistive agent onto the shaft seal portion 7 and its vicinity if the arrangement other than the arrangement of the third embodiment or the fourth embodiment is adopted. On the other hand, the arrangement of the third embodiment or the fourth embodiment enables to forcibly discharge a chemical out of the pressure vessel 1 through the fluid discharging port 9A along with the fluid flowing through the introducing channel 13 without the likelihood that the chemical reaches the shaft seal portion 7. Thus, this arrangement enables to effectively prevent corrosion of the shaft seal portion 7, and eliminates the requirement that a corrosion-resistive agent be applied onto the shaft seal portion 7 and/or its vicinity.

In the arrangements of the foregoing embodiments, the feeding port 8A of the fluid feeding means 8 is formed in the ceiling part of the pressure vessel 1 to feed supercritical carbon dioxide into the processing chamber 2 by way of the controlling member 10. Alternatively, the fluid feeding port 8A may be formed in a trunk part (side portion) of the pressure vessel 1 to feed supercritical carbon dioxide directly into the processing chamber 2.

In the foregoing embodiments, the support member 4 for rotatably supporting the object 3 constitutes the agitating unit of the invention. Alternatively, the agitating unit may include an agitating wing for agitating the fluid in the processing chamber 2. In the altered arrangement, it is preferable to integrally attach a wing or its equivalent to the support member 4.

It is possible to function the discharging port 9A of the fluid discharging means 9 as a main discharging port communicated outside of the processing chamber 2. Alternatively, it is possible to form a main discharging port independently of the fluid discharging port 9A, which is dedicatedly used for discharging particles, as shown in the drawings.

Next, a high-pressure processing apparatus as a fifth embodiment according to the invention is described with reference to FIG. 9.

The high-pressure processing apparatus according to the fifth embodiment is so configured as to suitably perform a series of processes from a chemical treating process, a cleaning process, and to a drying process in a single processing chamber of a pressure vessel. It should be appreciated that elements in the fifth embodiment that are identical to those in the first to the fourth embodiments are denoted at the same reference numeral, a description thereof is omitted herein, and parts of the fifth embodiment that are different from the features of the first to the fourth embodiments are described in detail.

In the fifth embodiment, the following arrangement is provided regarding fluid feeding means 8 and fluid discharging means 9 for feeding and discharging a high-pressure fluid (gas, liquid, subcritical fluid, supercritical fluid), chemical feeding means 15 and chemical discharging means 16 for feeding and discharging a chemical, respectively.

Specifically, a pressure vessel 1 is integrally formed with a vertically extending feeding hole 27 (channel) for feeding a corrosive fluid (hereinafter, referred to as "chemical") into a processing chamber 2, and a vertically extending chemical discharging hole 29 (channel) for discharging the chemical out of the processing chamber 2. The pressure vessel 1 is further integrally formed with valve structural members 26, 28 in such a manner that part of the valve structural members 26, 28 is protruded out of the chemical feeding hole 27 and the chemical discharging hole 29, respectively into the processing chamber 2.

Figure 9:
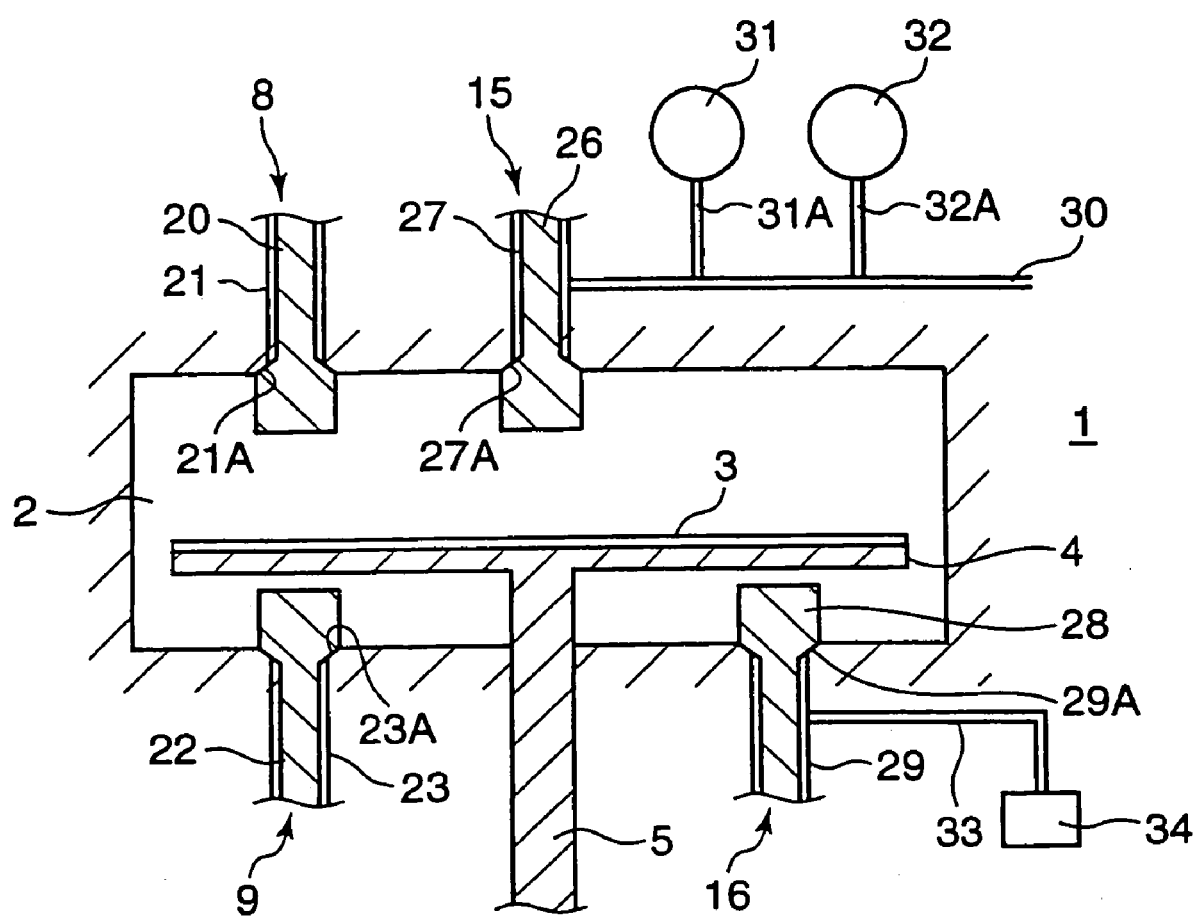
FIG. 9 is a sectional view showing essential parts of a high-pressure processing apparatus according to a fifth embodiment of the invention.

The valve structural member 26 (28) includes a poppet valve (mushroom valve), and is so constructed as to openably close the chemical feeding hole 27 (chemical discharging hole 29) as the valve structural member 26 (28) reciprocates in the axial direction of the chemical feeding hole 27 (chemical discharging hole 29), namely, in upward and downward directions in FIG. 9. The chemical feeding port 27A is formed generally at a center of axis of rotation of a support member 4 as opposed thereto.

The chemical feeding hole 27 is communicated and connected to a piping member 30, which is communicated to liquid feeding pumps 31, 32 via branch pipe members 31A, 32A, respectively. With this arrangement, different kinds of chemicals are suppliable to the chemical feeding hole 27 through the piping member 30 by selectively actuating the liquid feeding pumps 11 12 (sic).

The chemical discharging hole 29 is connected to a piping member 33 for collecting the chemical after the processing (waste liquid). A terminal end portion of the piping member 33 is exposed out of the pressure vessel 1, and is connected to a waste liquid collecting vessel 34 for collecting the waste liquid.

To sum up the above, in the high-pressure processing apparatus of the fifth embodiment, the valve structural member 26, the chemical feeding hole 27, the piping member 30 including branch pipe members 31A, 32A, and the pumps 31, 32 constitute the chemical feeding means 15, and the valve structural member 28, the chemical discharging hole 29, and the piping member 33 constitute the chemical discharging means 16.

The fluid feeding means 8 and the fluid discharging means 9 for feeding and discharging the high-pressure fluid have basically the same arrangement as the chemical feeding means 15 and the chemical discharging means 16.

Specifically, the pressure vessel 1 is integrally formed with a high-pressure fluid feeding hole 21 (channel) and a high-pressure fluid discharging hole 23 (channel) for feeding and discharging the high-pressure fluid (in this embodiment, supercritical carbon dioxide), independently of the chemical feeding hole 27 and the chemical discharging hole 29. The pressure vessel 1 is integrally formed with valve structural members 20 and 22 in such a manner that part of the valve structural members 20 and 22 is protruded out of the fluid feeding hole 21 and the fluid discharging hole 23 into the processing chamber 2, respectively. The valve structural member 20 (22) is so constructed as to openably close the fluid feeding hole 21 fluid discharging hole 23) as the valve structural member 20 (22) reciprocates in the axial direction of the fluid feeding hole 21 (fluid discharging hole 23). A fluid feeding line (not shown) for feeding a high-pressure fluid and a fluid discharging line (not shown) for discharging the high-pressure fluid are respectively communicated with the fluid feeding hole 21 and the fluid discharging hole 23.

More specifically, in the above high-pressure processing apparatus, the valve structural member 20, the fluid feeding hole 21, and the fluid feeding line constitute the high-pressure fluid feeding means 8, and the valve structural member 22, the fluid discharging hole 23, and the fluid discharging line constitute the high-pressure fluid discharging means 9.

The valve structural members 20, 22, 26, 28 integrally formed in the pressure vessel 1 are each made of the same pressure-resistive material as the pressure vessel 1.

Further, wall surfaces of the processing chamber 2, inner surfaces of the holes 21, 23, 27, 29, and outer surfaces of the valve structural members 20, 22, 26, 28 are coated with a corrosion-resistive agent such as fluoroethylene resin in order to prevent corrosion by the chemical. Furthermore, the chemical feeding and discharging lines for feeding and discharging the chemical namely, the piping members 30, 31A, 32A, 33 each include a resinous hose made of a corrosion-resistive material.

Next, processing operations of the high-pressure processing apparatus according to the fifth embodiment are described.

First, an object 3 is transported to the processing chamber 2 of the pressure vessel 1 by transporting means such as a handling robot, and is loaded on the support member 4.

Then, the processing chamber 2 is sealably closed, and the object 3 is treated with a predetermined chemical under an atmospheric pressure while being supplied with the chemical onto the object 3 by activating the chemical feeding means 15 to feed the chemical into the processing chamber 2. Specifically, at this time, the valve structural member 26 is activated to open the chemical feeding port 27A of the chemical feeding hole 27. In this state, the liquid feeding pumps 11, 12 (sic) are driven to feed the chemical into the processing chamber 2 through the piping member 30 and the chemical feeding hole 26. At this time, the fluid feeding port 21A, the fluid discharging port 23A for feeding and discharging the supercritical carbon dioxide, and the chemical discharging port 29A for discharging the chemical are closed by the valve structural member 20, 22, 28, respectively.

When the chemical is supplied to the processing chamber 2, the chemical is supplied substantially in the middle of the surface of the object 3 since the chemical feeding port 27A is located generally above the center of axis of rotation of the support member 4. At the time of feeding the chemical, as the support member 4 is rotated, the chemical uniformly spreads over the entire surface of the object 3, thus performing the chemical treatment (washing) efficiently and uniformly.

When the washing process is completed, the valve structural member 28 is actuated to open the chemical discharging port 29A for discharging the chemical after the processing. Thereby, the chemical after the processing in the processing chamber 2 is drawn out of the processing chamber 2 through the chemical discharging hole 29, and is collected in the waste liquid collecting vessel 34 through the piping member 33. It is preferable to partition the waste liquid collecting vessel 34 into several parts for collecting the chemicals, water, organic solvent, etc. individually.

As the waste liquid (chemical) is discharged from the processing chamber 2, the chemical feeding port 27A and the chemical discharging port 29A are closed by actuation of the valve structural members 26 and 28. Thereafter, the valve structural member 15 (sic) is actuated to open the fluid feeding port 21A. Thereby, while feeding the supercritical carbon dioxide into the processing chamber 2, the temperature and pressure inside the processing chamber 2 are raised and kept in a certain temperature and pressure range.

In this way, as the supercritical carbon dioxide is fed to the processing chamber 2, the chemical, water, organic solvent, etc. that have stayed on the object surface after the predetermined processing are washed away by trapping and dissolution in the supercritical carbon dioxide. Thus, the object 3 is dried in a desirable manner without causing size reduction of the pores and grooves of the microstructure on the object 3 and generation of cracks on the object surface. Since the support member 4 is rotated at the time of drying process, efficient and uniform drying process can be performed onto the object 3. The supercritical drying process may be performed in a sealed state of the processing chamber 2 by closing the fluid feeding port 21A upon verifying that a certain temperature and pressure has been established in the processing chamber 2. Alternatively, supercritical carbon dioxide may be allowed to flow (circulated) in the processing chamber 2 in a state that both of the fluid feeding port 21A and the fluid discharging port 23A are kept opened.

Upon completion of the drying process, the rotation of the support member 4 is suspended. Then, upon verifying that the supercritical carbon dioxide has been completely discharged and the pressure inside the processing chamber 2 has returned to the atmospheric pressure, the object 3 is unloaded from the pressure vessel 1 by the transporting means. Thus, a series of processes are completed.

According to the high-pressure processing apparatus in the fifth embodiment, a series of processes from the chemical treating process to the drying process are performed in the single pressure vessel 1. Since the feeding and discharging of the chemical or its equivalent are performed systematically as mentioned above, this arrangement is advantageous in desirably performing the predetermined processes onto the object 3 without a possibility of corrosion of parts due to contact with the chemical.

Specifically, in the above high-pressure processing apparatus, the valve structural member 26 is provided in the chemical feeding hole 27 integrally formed in the pressure vessel 1. The valve structural member 26 is actuated to open the chemical feeding port 27A. The chemical feeding line (piping member 30 and the like) is connected to the appropriate position of the chemical feeding hole 27. With this arrangement, there is no likelihood that the pressurized state of the processing chamber 2 may adversely affect the chemical feeding line due to the closing of the chemical feeding port 27A by the valve structural member 26. In other words, since the chemical feeding port 27A is securely kept in a closed state during the drying process with the supercritical carbon dioxide, there is no likelihood that the chemical feeding line is subjected to a pressurized state.

This arrangement does not necessitate designing of the apparatus considering that the chemical feeding line should be constructed rigid enough against a high pressure. Namely, it is possible to construct the chemical feeding line according to the specifications operable under a normal pressure (atmospheric pressure). It is possible to construct the chemical feeding line by a resinous hose or its equivalent made of a corrosion-resistive material. In other words, this arrangement enables to provide an apparatus equipped with a chemical feeding line which has a small diameter and long length while taking desirable measures against corrosion. Likewise, this arrangement enables to provide a corrosion-proof apparatus even if equipped with a chemical discharging line (piping member 33, etc.) which has a small diameter and long length.

With the above arrangement, particle generation due to corrosion of the chemical feeding and discharging lines can be effectively prevented. As a result, a series of processes from the chemical treating process to the drying process onto the object 3 can be desirably performed in the single pressure vessel 1.

In the above high-pressure processing apparatus, the chemical feeding and discharging lines are each made of a resinous hose having a corrosion-resistive property. Alternatively, other measures against corrosion may be applicable to the chemical feeding and discharging lines. In any case, the chemical feeding and discharging lines can be designed according to the specifications operable under a normal pressure. This arrangement enables to apply a highly specific corrosion-resistive agent or the like which is generally inappropriate for use under a high pressure considering the durability of the piping members and the like, as the measures against corrosion.

Figure 10:
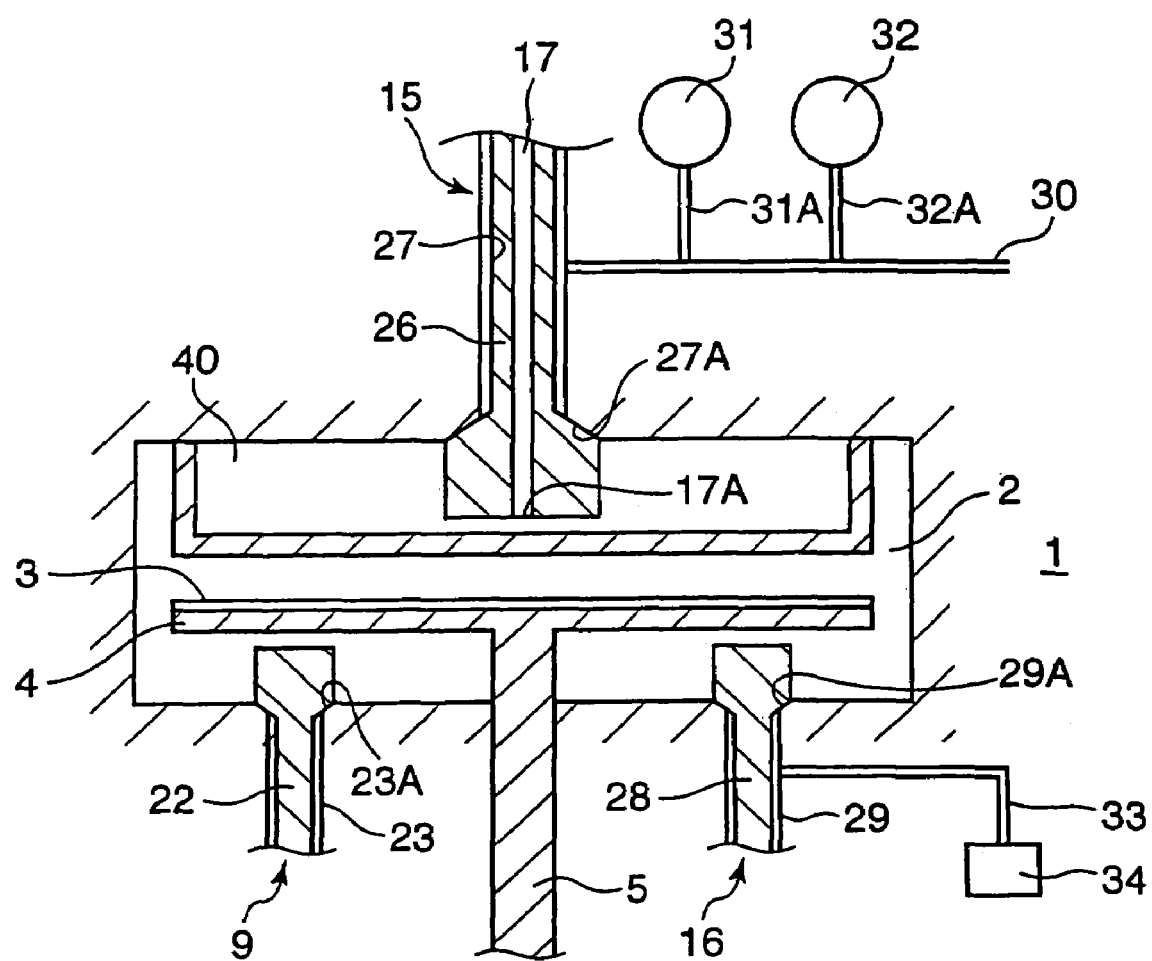
FIG. 10 is a sectional view showing essential parts of a high-pressure processing apparatus according to a sixth embodiment of the invention.

Next, a high-pressure processing apparatus as a sixth embodiment of the invention is described with reference to FIG. 10. It should be appreciated that elements in the sixth embodiment that are identical to those in the fifth embodiment are denoted at the same reference numeral, a description thereof is omitted herein, and parts of the sixth embodiment that are different from the features of the fifth embodiment are described in detail.

In the sixth embodiment, chemical feeding means 15 also functions as means for feeding supercritical carbon dioxide in place of the arrangement in the fifth embodiment in which the fluid feeding means 8 is dedicatedly used for feeding supercritical carbon dioxide. Specifically, a fluid feeding channel 17 is formed in the center (axial center) of a valve structural member 26 constituting the chemical feeding means 15 to feed supercritical carbon dioxide therethrough. The fluid feeding channel 17 includes a fluid feeding port 17A opened from a lower end portion of the valve structural member 26. A fluid feeding line (not shown) for feeding supercritical carbon dioxide is communicated to the fluid feeding channel 17.

A processing chamber 2 further includes a reservoir section 40 formed underneath the fluid feeding port 17A and a chemical feeding port 27A to temporarily store the chemical therein and feed the chemical onto an object 3. The reservoir section 40 has a so-called showerhead structure formed with a multitude of pores on a surface thereof.

In the sixth embodiment, upon verifying that a fluid discharging port 23A and a chemical discharging port 29A are closed, the valve structural member 26 is activated to open the chemical feeding port 27A, thereby feeding a certain amount of the chemical in the reservoir section 40 for temporary storage. Thereafter, the chemical feeding port 27A is closed, and supercritical carbon dioxide is started to feed into the reservoir section 40 through the fluid feeding channel 17 of the valve structural member 26.

Thereby, the chemical that has been temporarily stored in the reservoir section 40 is mixed with the supercritical carbon dioxide, and the mixed solution is fed onto an object 3 loaded on a support member 4 in a shower through the multitude of pores formed in the reservoir section 40, thereby performing a predetermined process (washing). At this time, the support member 4 is rotated according to needs. Thus, the chemical uniformly spreads over the entire surface of the object 3, thereby performing efficient and uniform chemical treatment.

When the washing is completed, the chemical discharging port 29A is opened to collect the chemical staying in the processing chamber 2 to a waste liquid collecting vessel 34 through a chemical discharging hole 29.

When the waste liquid (chemical) in the processing chamber 2 is started to be discharged through the chemical discharging hole 29, supercritical carbon dioxide is started to be fed into the processing chamber 2 through the fluid feeding port 17A. Thereby, a drying process onto the object 3 is performed in the similar manner as the fifth embodiment. At this time, the support member 4 is rotated according to needs. Thus, efficient and uniform drying process is performed onto the object 3.

According to the sixth embodiment, since the object 3 is washed with the mixed solution of supercritical carbon dioxide and a chemical the chemical reaches deep inside the micropores and grooves formed in the object surface, thereby performing the washing process more efficiently.

In the high-pressure processing apparatus, waste liquid (mixture of chemical and supercritical carbon dioxide) that has been used in the washing process is collected to the waste liquid collecting vessel 14 (sic) through the chemical discharging hole 29, a piping member 33, etc. As an exemplified arrangement, a pressure-reducing valve or a pressure-regulating valve (not shown) is provided at an upstream side of the waste liquid collecting vessel 34 to collect the waste liquid into the waste liquid collecting vessel 34 with its temperature and pressure maintained at a certain level. In such a case, the waste liquid collecting vessel 34 may function as a high-pressure vessel. In view of this, the temperature and pressure to be monitored in the waste liquid collecting vessel 34 are determined depending on the kind of chemical to be used, and the waste liquid is separated into the supercritical carbon dioxide and the chemical in the waste liquid collecting vessel 34.

In the above high-pressure processing apparatus, supercritical carbon dioxide is fed through the fluid feeding channel 17 formed in the valve structural member 26. Since the fluid feeding port 17A is kept in an opened state, it is preferable to take measures against corrosion due to contact with a chemical by coating, e.g., a corrosion-resistive agent such as fluoroethylene resin onto the inner surface of the fluid feeding channel 17. In such a case, it is more effective to allow carbon dioxide in a normal pressure or the like to flow in the fluid feeding channel 17 during the feeding of the chemical because such an arrangement enables to prevent intrusion of the chemical into the fluid feeding channel 17, which provides a more advantageous measures against corrosion.

Next, a high-pressure processing apparatus as a seventh embodiment according to the invention is described with reference to FIG. 11.

The seventh embodiment is different from the fifth embodiment in the arrangement of fluid feeding means 8, chemical feeding means 15, fluid discharging means 9, and chemical discharging means 16.

Figure 11:
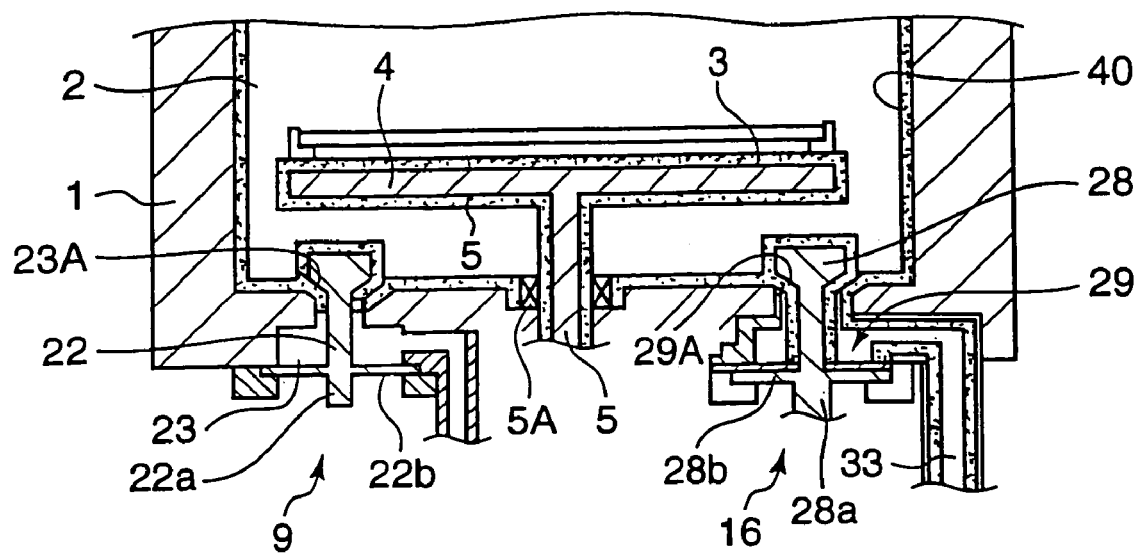
FIG. 11 is a sectional view showing essential parts of a high-pressure processing apparatus according to a seventh embodiment of the invention.

Specifically, in the seventh embodiment, as shown in FIG. 11, a valve structural member 28 for openably closing a chemical discharging port 29A includes a support rod (valve rod) 28a on which a metallic diaphragm 28b is mounted. Fixedly mounting the diaphragm 28b on a wall surface of a pressure vessel 1 fixedly supports the valve structural member 28 on the pressure vessel 1. The diaphragm 28b and the wall surface of the pressure vessel 1 define a chemical discharging hole 29.

Similar to the valve structural member 28, a valve structural member 22 for openably closing a fluid discharging port 23A includes a support rod (valve rod) 22a on which a diaphragm 22b is mounted. Fixedly mounting the diaphragm 22b on a wall surface of the pressure vessel 1 fixedly supports the valve structural member 22 on the pressure vessel 1. The diaphragm 22b and the wall surface of the pressure vessel 1 define a fluid discharging hole 23.

Although not illustrated, the fluid feeding means 8 and the chemical feeding means 15 have basically the same construction as the fluid discharging means 9 and the chemical discharging means 16.

According to the seventh embodiment, the valve structural member 28 is easily mounted on the pressure vessel 1, and the chemical discharging hole 29 is easily connected to a piping member 33e for communication. This is advantageous in assembling of the parts.

The portion indicated by the sandblasted portion in FIG. 11 (portion indicated by the numeral 40) is made of a corrosion-resistive material. Likewise, the wall surfaces of the processing chamber 2, the surfaces of a support shaft portion 5 and a support member 4, the surfaces of the valve structural members 22, 28 and the diaphragm 28b (indication of sandblasted portion is omitted), and the inner surface of the piping member 33 are coated with a corrosion-resistive agent.

Next, a high-pressure processing apparatus as an eighth embodiment according to the invention is described with reference to FIG. 12.

The eighth embodiment is different from the fifth embodiment in the aspect of fluid feeding means 8, chemical feeding means 15, fluid discharging means 9, and chemical discharging means 16.

Specifically, in the eighth embodiment, a head portion 26a of a valve structural member 26 for openably closing a chemical feeding port 27A is provided in a conical large-diametrical channel 27B formed in an appropriate portion of a chemical feeding channel 27. The head portion 26a of the valve structural member 26 is arranged in a pressure vessel 1 (inside of a wall constituting a processing chamber 2) in such a manner that the chemical feeding port 27A is openably closed by moving the valve structural member 26 downward from the opposite side of the pressure vessel 1 where the processing chamber 2 is formed (from the upper side in FIG. 12).

The head portion (valve portion) 26a of the valve structural member 26 has a lead end thereof formed into a substantially conical shape. The conical channel 27B also has a substantially conical shape corresponding to the head portion 26a with a lead end thereof tapered toward the chemical feeding port 27A.

According to the eighth embodiment, as the valve structural member 26 is lowered, and the head portion 26a is abutted against the lower surface of the conical channel 27B, namely, the lower surface of the substantially conical portion thereof, the chemical feeding port 27A is closed, thereby suspending feeding of the chemical.

Figure 12:
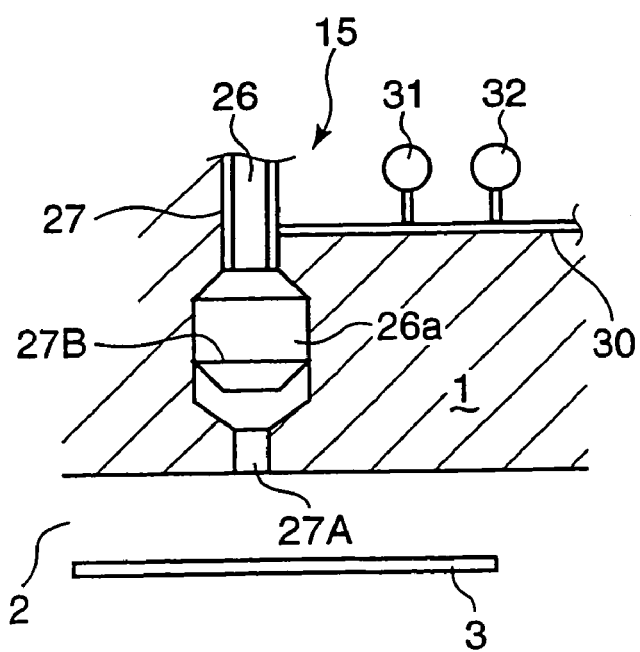
FIG. 12 is a sectional view showing essential parts of a high-pressure processing apparatus according to an eighth embodiment of the invention.

On the other hand, as shown in FIG. 12, when the valve structural member 26 is raised, and the head portion 26a is moved away from the lower surface of the conical channel 27B, the chemical feeding port 27A is opened to thereby allow the chemical to be fed into the processing chamber 2. At this time, when the chemical is drawn into the chemical feeding port 27A whose diameter is smaller than the conical channel 27B, the flowing rate of the chemical is increased. As a result, the chemical is supplied into the processing chamber 2 at the increased flowing rate. Thus, the chemical is securely supplied onto the object 3.

In the fifth to the eighth embodiments, as mentioned above, the object 3 (support member 4) is rotated according to needs during the processing. This arrangement enables to perform efficient and uniform processing onto the object 3. In view of this, it is preferable to provide a sealing member 5A as shown in FIG. 11 between the shaft portion 5 and the pressure vessel 1 for sealing. Providing the sealing member 5A in one of the arrangements of the first to the fourth embodiments enables to effectively prevent intrusion of particles into the processing chamber 2.

In the first to the eighth embodiments, supercritical carbon dioxide is used in the drying process. The fluid is not necessarily supercritical carbon dioxide. A high-pressure fluid having a pressure of e.g. 1 MPa or more, preferably, a high-pressure fluid having high density, high solubility, low viscosity, and high diffusiveness may be used. As a further altered arrangement, a subcritical fluid may be used in place of the supercritical fluid.

In the first to the eighth embodiments, described is the case where a single object 3 is loaded on the support member 4. The processing apparatus may be so configured as to be capable of loading a plurality of objects 3 on the support member 4.

In the fifth to the eighth embodiments, described is the case where washing and drying processes are performed. The chemical treating process onto the object 3 is not limited to washing. For example, a developer, which is an alkali aqueous solution, may be used as a chemical and fed onto an object (e.g. semiconductor wafer) to perform development with respect to a photoresist layer. Then, after the development, washing and drying processes may be performed with use of supercritical carbon dioxide.

In the above case, washing process for the purpose of removing the residue of the developer may be performed under an atmospheric pressure in the similar manner as the foregoing embodiments (fifth to eighth embodiments). In other words, after the development with use of a corrosive chemical, washing and drying processes may be performed with use of a non-corrosive chemical, supercritical carbon dioxide, etc. This altered arrangement is described in detail with reference to FIG. 9. Specifically, an object (semiconductor wafer) 3 is loaded on the support member 4, and development is carried out under an atmospheric pressure with a chemical such as an organic alkali aqueous solution or a thinner being fed and discharged by actuation of the chemical feeding means 15 and the chemical discharging means 16, respectively. Thereafter, a non-corrosive chemical such as mixed fluid of water or isopropylalcohol with supercritical carbon dioxide is fed to and discharged from the processing chamber 2 by the high-pressure fluid feeding means 15 and the high-pressure fluid discharging means 16 respectively to perform washing and drying processes under a high pressure.

To sum up the invention, according to an aspect of the invention, the high-pressure processing apparatus comprises: a processing vessel which is formed with a processing chamber therein to perform a certain process onto an object; fluid feeding means which feeds a high-pressure fluid into the processing chamber; fluid discharging means which discharges the high-pressure fluid from the processing chamber; an agitating unit which is arranged in the processing chamber and is operative to flow the high-pressure fluid onto the object by relative rotation to the processing vessel; a communicating channel which is formed in the processing vessel to communicate inside and outside of the processing chamber; a rotary driving member which is coupled to the agitating unit via a shaft portion provided in the communicating channel; and a sealing portion which is provided between the shaft portion and the processing vessel to disconnect the processing chamber from the rotary driving member. The fluid discharging means includes a fluid discharging port formed in a certain position of the communicating channel closer to the processing chamber than the sealing portion to discharge the high-pressure fluid.

With this arrangement, drivingly rotating the agitating unit enables to perform efficient and uniform processing onto the object. Furthermore, since the high-pressure fluid flows through the communicating channel and is discharged out of the processing chamber through the fluid discharging port during the processing, particles that have been generated around the sealing portion can be discharged outside of the apparatus along with the high-pressure fluid. This arrangement enables to perform the processing onto the object such as a semiconductor wafer optimally without the likelihood that the particles generated around the sealing portion may be intruded in the processing chamber.

In the above high-pressure processing apparatus, the agitating unit may include a support member on which the object is supported in the processing chamber.

In the above arrangement, the support member and the object supported thereon are integrally rotated during the processing. Thereby, efficient and uniform processing can be performed onto the object with the high-pressure fluid being allowed to spread desirably onto the object.

In the above high-pressure processing apparatus, it is preferable to provide a labyrinth structure at a certain position of the communicating channel and between the sealing portion and the fluid discharging port.

With the above arrangement, since the labyrinth structure is provided in the communicating channel and between the processing chamber and the sealing portion, it is less likely that particles generated around the sealing portion be moved toward the processing chamber through the communicating channel 11. Thereby, intrusion of particles into the processing chamber can be more effectively prevented.

In the above high-pressure processing apparatus, it is preferable to form a fluid introducing channel in a certain position of the communicating channel and between the sealing portion and the fluid discharging port to draw a fluid identical to or different from the high-pressure fluid into the communicating channel, wherein the fluid introducing channel is so constructed as to discharge the fluid that has been introduced from the fluid introducing channel outside of the processing vessel through the fluid discharging port.

With this arrangement, the fluid is drawn into the communicating channel through the fluid introducing channel and is discharged out of the processing chamber through the fluid discharging port. Thereby, particles generated around the sealing portion are discharged out of the fluid discharging port along with the flow of the fluid. This arrangement effectively prevents intrusion of the particles into the processing chamber.

In the above case, it is preferable to provide a labyrinth structure at a certain position of the communicating channel and between the sealing portion and the fluid introducing channel and/or between the fluid introducing channel and the fluid discharging port.

With the above arrangement, intrusion of particles into the processing chamber can be more effectively prevented.

According to another aspect of the invention, the high-pressure processing apparatus comprises: a processing vessel formed with a processing chamber therein, a support member which supports an object loaded in the processing chamber thereon; fluid feeding/discharging means which feeds and discharges a high-pressure fluid in and out of the processing chamber; a communicating channel which is formed in the processing vessel to communicate with the processing chamber; a valve structural member which is operatively supported to the processing vessel in the communicating channel to openably close the communicating channel; and a piping member which is communicated and connected to the communicating channel for feeding and/or discharging a corrosive fluid in and out of the processing chamber. The corrosive fluid is different from the high-pressure fluid.

With this arrangement, a poppet valve can be used as the valve structural member. In such an arrangement, fluoroethylene resin, ceramics and the like can be coated on the valve structural member.

In the above high-pressure processing apparatus, the piping member can be so constructed as to be usable under an atmospheric pressure.

In the above arrangement, while the communicating channel is closed during the processing with the high-pressure fluid, there is no likelihood that the piping member for feeding the corrosive fluid may be affected by the high pressure. Accordingly, the above arrangement makes it possible to use a material, which is technically inappropriate for use as a piping member under a high pressure, e.g., a resinous hose having corrosion resistance, as such a piping member. This is advantageous in taking measures against corrosion. With this arrangement, there can be prevented the problem in advance that particles may be generated due to corrosion of the piping member and intruded in the processing chamber, which resultantly leads to contamination of the object.

In the above high-pressure processing apparatus, preferably, the fluid feeding/discharging means includes a fluid feeding channel which is formed in the processing vessel to communicate with the processing chamber, a valve structural member which is operatively supported to the processing vessel in the fluid feeding channel to openably close the fluid feeding channel, and a piping member which is communicated and connected to the fluid feeding channel to feed and/or discharge the high-pressure fluid in and out of the processing vessel.

In the above arrangement where the fluid feeding/discharging means for feeding/discharging the high-pressure fluid has generally the same construction as the feeding/discharging means for feeding/discharging a corrosive fluid, the valve structural member of the fluid feeding/discharging means can adopt a poppet valve. Thereby, it is possible to coat fluoroethylene resin, ceramics, and the like on the valve structural member of the fluid feeding/discharging means.

In the above high-pressure processing apparatus, it is preferable to form a fluid feeding hole in the valve structural member to feed the high-pressure fluid into the processing chamber.

With this arrangement, the valve structural member for feeding a corrosive fluid can be optimally incorporated in the fluid feeding means. Particularly, this arrangement is advantageous in feeding the corrosive fluid and the high-pressure fluid in a mixed state (in a dissolved state).

In the above high-pressure processing apparatus, it is preferable to provide a reservoir section in the processing chamber for temporarily storing a corrosive fluid to feed the corrosive fluid onto the object. Further, preferably, the fluid feeding means is so constructed as to feed the high-pressure fluid into the reservoir section.

With the above arrangement, it is possible to feed the corrosive fluid and the high-pressure fluid onto the object in a mixed (dissolved) state.

According to yet another aspect of the invention, a high-pressure processing method comprises the steps in the order of feeding a corrosive fluid in a processing chamber of a pressure vessel; washing an object supportively loaded in the processing chamber with the corrosive fluid under an atmospheric pressure; discharging the corrosive fluid out of the processing chamber; and feeding a high-pressure fluid into the processing chamber to dry the object.

In this arrangement, after being washed under the atmospheric pressure in the processing chamber, the object is dried in the processing chamber with the high-pressure fluid. Thus, the processing operations onto the object can be performed in the single processing chamber.

According to still another aspect of the invention, a high-pressure processing method comprises the steps in the order of feeding a corrosive fluid in a processing chamber of a pressure vessel; applying a developer onto an object supportively loaded in the processing chamber under an atmospheric pressure for development; discharging the corrosive fluid out of the processing chamber; and feeding a high-pressure fluid into the processing chamber to wash and dry the object.

In the above arrangement, after being applied with the developer in the processing chamber under the atmospheric pressure, the object is dried in the processing chamber with the high-pressure fluid. Thus, the processing operations onto the object can be performed in the single processing chamber.

This application is based on Japanese patent application serial Nos. 2001-128276 and 2001-133003 filed in Japan Patent Office, the contents of which are hereby incorporated by references.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A high-pressure processing method comprising the steps of:
    feeding a corrosive fluid into a processing chamber of a pressure vessel through a first feeding communication channel;
    washing an object supportively loaded in the processing chamber with the corrosive fluid under an atmospheric pressure;
    discharging the corrosive fluid out of the processing chamber through a first discharging communication channel;
    feeding a high-pressure fluid into the processing chamber through a second feeding communication channel to dry the object while keeping the first feeding communication channel and the first discharging communication channel closed; and
    discharging the high pressure fluid out of the processing chamber through a second discharging communication channel while keeping the first feeding communication channel and the first discharging communication channel closed.

2. A high-pressure processing method comprising the steps of:
    feeding a corrosive fluid into a processing chamber of a pressure vessel through a first feeding communication channel;
    applying a developer onto an object supportively loaded in the processing chamber under an atmospheric pressure for development;
    discharging the corrosive fluid out of the processing chamber through a first discharging communication channel;
    feeding a high-pressure fluid into the processing chamber through a second feeding communication channel to wash and dry the object while keeping the first feeding communication channel and the first discharging communication channel closed; and
    discharging the high pressure fluid out of the processing chamber through a second discharging communication channel while keeping the first feeding communication channel and the first discharging communication channel closed.

* * * * *